United States Patent
Brar et al.

(10) Patent No.: US 11,785,740 B2
(45) Date of Patent: Oct. 10, 2023

(54) HIGH-VOLTAGE JUNCTION BOX COOLANT BAFFLE

(71) Applicant: LEAR CORPORATION, Southfield, MI (US)

(72) Inventors: Parminder Brar, Ontario (CA); Ajmal Ansari, Canton, MI (US); Jared Pieknik, Westland, MI (US); Michael Scott Duco, Fraser, MI (US); Kevin J. Foldvary, Pinckney, MI (US)

(73) Assignee: LEAR CORPORATION, Southfield, MI (US)

( * ) Notice: Subject to any disclaimer, the term of this patent is extended or adjusted under 35 U.S.C. 154(b) by 179 days.

(21) Appl. No.: 17/328,117

(22) Filed: May 24, 2021

(65) Prior Publication Data

US 2021/0410326 A1    Dec. 30, 2021

Related U.S. Application Data

(60) Provisional application No. 63/044,540, filed on Jun. 26, 2020.

(51) Int. Cl.
*H05K 7/20* (2006.01)
*H01L 23/473* (2006.01)

(52) U.S. Cl.
CPC ....... *H05K 7/20254* (2013.01); *H01L 23/473* (2013.01); *H05K 7/20509* (2013.01); *H05K 7/20927* (2013.01)

(58) Field of Classification Search
CPC ........... H05K 7/20254; H05K 7/20509; H05K 7/20927; H05K 7/20872; H05K 5/0217
See application file for complete search history.

(56) References Cited

U.S. PATENT DOCUMENTS

| 7,965,510 B2 | 6/2011 | Suzuki et al. |
| 9,622,377 B2 | 4/2017 | Rai et al. |
| 2006/0050483 A1 | 3/2006 | Wilson et al. |

(Continued)

FOREIGN PATENT DOCUMENTS

| CN | 102192037 A | 9/2011 |
| CN | 102957328 A | 3/2013 |

(Continued)

OTHER PUBLICATIONS

Office Action for Chinese Application No. 202110702287.2 filed Jun. 24, 2021, dated Oct. 19, 2022, 26 pgs.

*Primary Examiner* — Adam B Dravininkas
(74) *Attorney, Agent, or Firm* — Brooks Kushman P.C.

(57) ABSTRACT

An electronic module is provided with a housing with a base and walls extending transversely from the base. The housing comprises an inlet port and an outlet port formed through the walls. A circuit board assembly is supported by the housing and includes electronics that generate heat during operation. A cold plate is mounted to the walls of the housing to define a manifold. The housing and the cold plate are in thermal communication with the circuit board assembly for transferring heat generated by the electronics. A baffle is disposed within the manifold for directing coolant flow. Elastic material is disposed over a distal end of the baffle and adapted to engage a lower surface of the cold plate in an interference fit to block coolant leakage.

20 Claims, 4 Drawing Sheets

(56) References Cited

U.S. PATENT DOCUMENTS

| | | | | |
|---|---|---|---|---|
| 2012/0212175 A1* | 8/2012 | Sharaf | ............... | H05K 5/069 |
| | | | | 220/592.01 |
| 2013/0235527 A1* | 9/2013 | Wagner | ............ | H05K 1/0203 |
| | | | | 29/832 |
| 2015/0334874 A1* | 11/2015 | Rai | .............. | H01F 27/08 |
| | | | | 361/699 |
| 2016/0270258 A1* | 9/2016 | Rai | ............... | H05K 7/20927 |
| 2016/0322280 A1 | 11/2016 | Schmit et al. | | |
| 2019/0263280 A1* | 8/2019 | Tang | ............ | H05K 7/20263 |
| 2020/0015384 A1* | 1/2020 | Tivadar | ............ | H05K 1/0203 |
| 2020/0409398 A1 | 12/2020 | Gebrehiwot et al. | | |

FOREIGN PATENT DOCUMENTS

| | | |
|---|---|---|
| CN | 105979752 A | 9/2016 |
| CN | 106465563 A | 2/2017 |
| CN | 108099681 A | 6/2018 |
| DE | 102016223889 A1 | 6/2018 |
| EP | 1391673 A2 | 2/2004 |
| EP | 1561980 A1 | 8/2005 |
| JP | 2015065310 A | 4/2015 |

\* cited by examiner

HIGH-VOLTAGE JUNCTION BOX COOLANT BAFFLE

CROSS-REFERENCE TO RELATED APPLICATIONS

This application claims the benefit of U.S. provisional application Ser. No. 63/044,540 filed Jun. 26, 2020, the disclosure of which is hereby incorporated in its entirety by reference herein.

TECHNICAL FIELD

One or more embodiments relate to a baffle for directing coolant through a high-voltage junction box.

BACKGROUND

Cold plates are used for cooling electronics, such as the power electronics included in high-voltage junction boxes for electric or hybrid vehicle battery chargers. Such power electronics convert AC power from the grid into DC power for charging the vehicle batteries. The power electronics generate heat while operating. High-voltage junction boxes may include a liquid cooled cold plate to dissipate the heat. Such high-voltage junction boxes may also include a baffle to direct coolant flow. U.S. Pat. No. 9,622,377 to Rai et al. and assigned to Lear Corporation describes an example of a cold plate having a separable flow directing baffle.

SUMMARY

In one embodiment, a manifold assembly is provided with a housing with a base, walls extending transversely from the base, and an inlet port and an outlet port formed through the walls. A cover is mounted on top of the walls to define a manifold for coolant flow. A baffle is disposed within the manifold to direct coolant flow between the inlet port and the outlet port, and elastic material is disposed over a distal end of the baffle to engage a lower surface of the cover and block coolant leakage.

In another embodiment, an electronic module is provided with a housing with a base and walls extending transversely from the base. The housing comprises an inlet port and an outlet port formed through the walls. A circuit board assembly is supported by the housing and includes electronics that generate heat during operation. A cold plate is mounted to the walls of the housing to define a manifold. The housing and the cold plate are in thermal communication with the circuit board assembly for transferring heat generated by the electronics. A baffle is disposed within the manifold for directing coolant flow. Elastic material is disposed over a distal end of the baffle and adapted to engage a lower surface of the cold plate in an interference fit to block coolant leakage.

In yet another embodiment, a method is provided for manufacturing an electronic module. A baffle is disposed in a fluid manifold that is formed in a housing. Elastic material is molded over a distal end of the baffle and through an aperture in the baffle to secure the elastic material. A cold plate is installed on the manifold to seal the manifold and compress the elastic material to block coolant leakage. An electronics assembly is mounted to the cold plate in thermally conductive communication with the manifold.

In one embodiment a high-voltage junction box is provided with a housing including a base and walls extending transversely from the base. The housing includes an inlet port and an outlet port that are formed through the walls. A circuit board assembly is supported by the housing and includes power electronics that generate heat during operation. A cold plate is mounted to the walls of the housing to define a manifold. The housing and the cold plate are in thermal communication with the circuit board assembly for absorbing heat generated by the power electronics. The cold plate, the inlet port, and the outlet port are adapted to collectively facilitate coolant flow through the manifold. A baffle is disposed within the manifold for directing coolant flow. The baffle includes a support for resting upon the base of the housing, a fin extending from the support, and elastic material disposed over a distal end of the fin that is adapted to engage a lower surface of the cold plate in an interference fit to block coolant flow.

The invention also provides an electronic module with a housing including a base and walls extending transversely from the base. The housing includes an inlet port and an outlet port that are formed through the walls. A circuit board assembly is supported by the housing and includes electronics that generate heat during operation. A cold plate is mounted to the walls of the housing to define a manifold. The housing and the cold plate are in thermal communication with the circuit board assembly for absorbing heat generated by the electronics. The cold plate, the inlet port, and the outlet port are adapted to collectively facilitate coolant flow through the manifold. A baffle is disposed within the manifold for directing coolant flow. The baffle includes a support for resting upon the base of the housing, a fin extending from the support, and elastic material disposed over a distal end of the fin that is adapted to engage a lower surface of the cold plate in an interference fit to block coolant flow.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
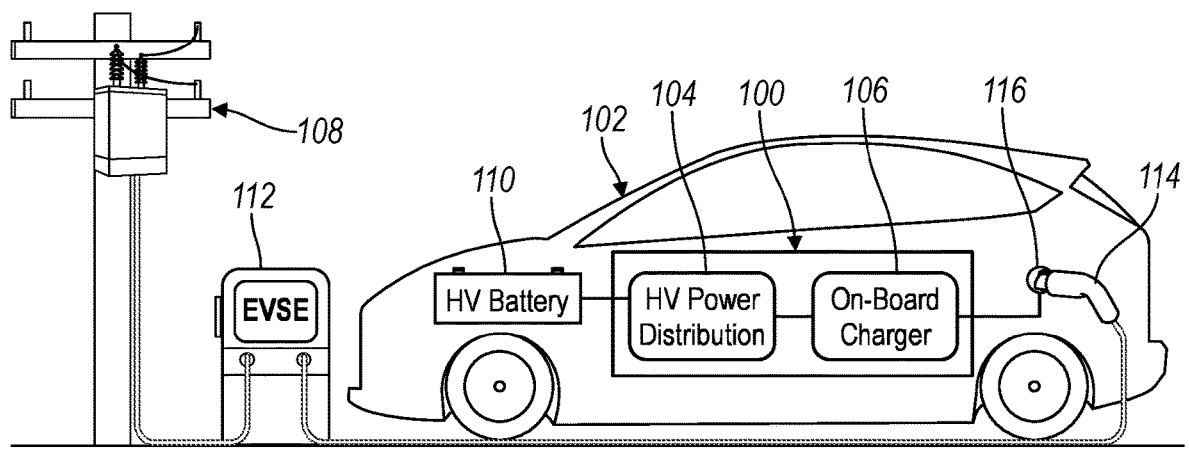
FIG. 1 is a schematic diagram of an electrified vehicle with a high-voltage junction box according to one or more embodiments.

With reference to FIG. 1, an electronic control module, such as a high-voltage junction box (HVJB), is illustrated in accordance with one or more embodiments and generally referenced by numeral 100. The HVJB 100 is depicted within a vehicle 102 and includes a high-voltage (HV) power distribution module 104 and an on-board charger (OBC) 106. The HVJB 100 electrically connects an external power supply 108 to a traction battery 110 to facilitate charging. The OBC 106 and the HV power distribution module 104 collectively condition the power supplied from the external power supply 108 to provide the proper voltage and current levels to the traction battery 110.

The external power supply 108 is electrically coupled to electric vehicle supply equipment (EVSE) 112, e.g., a charger or a charging station. The external power supply 108 is an electrical power distribution network or grid as provided by an electric utility company, according to one or more embodiments. The EVSE 112 provides circuitry and controls to regulate and manage the transfer of energy between the external power supply 108 and the vehicle 102. The external power supply 108 provides AC electric power to the EVSE 112. The EVSE 112 includes a charge connector 114 for plugging into a charge port 116 of the vehicle 102. The charge port 116 may be any type of port to transfer power from the EVSE 112 to the HVJB 100. The HVJB 100 converts the AC power received from the EVSE 112 to a high-voltage (HV) DC power output for charging the traction battery 110. This might typically in the hundreds of volts, such as a voltage of 300 volts or more.

Figure 2:
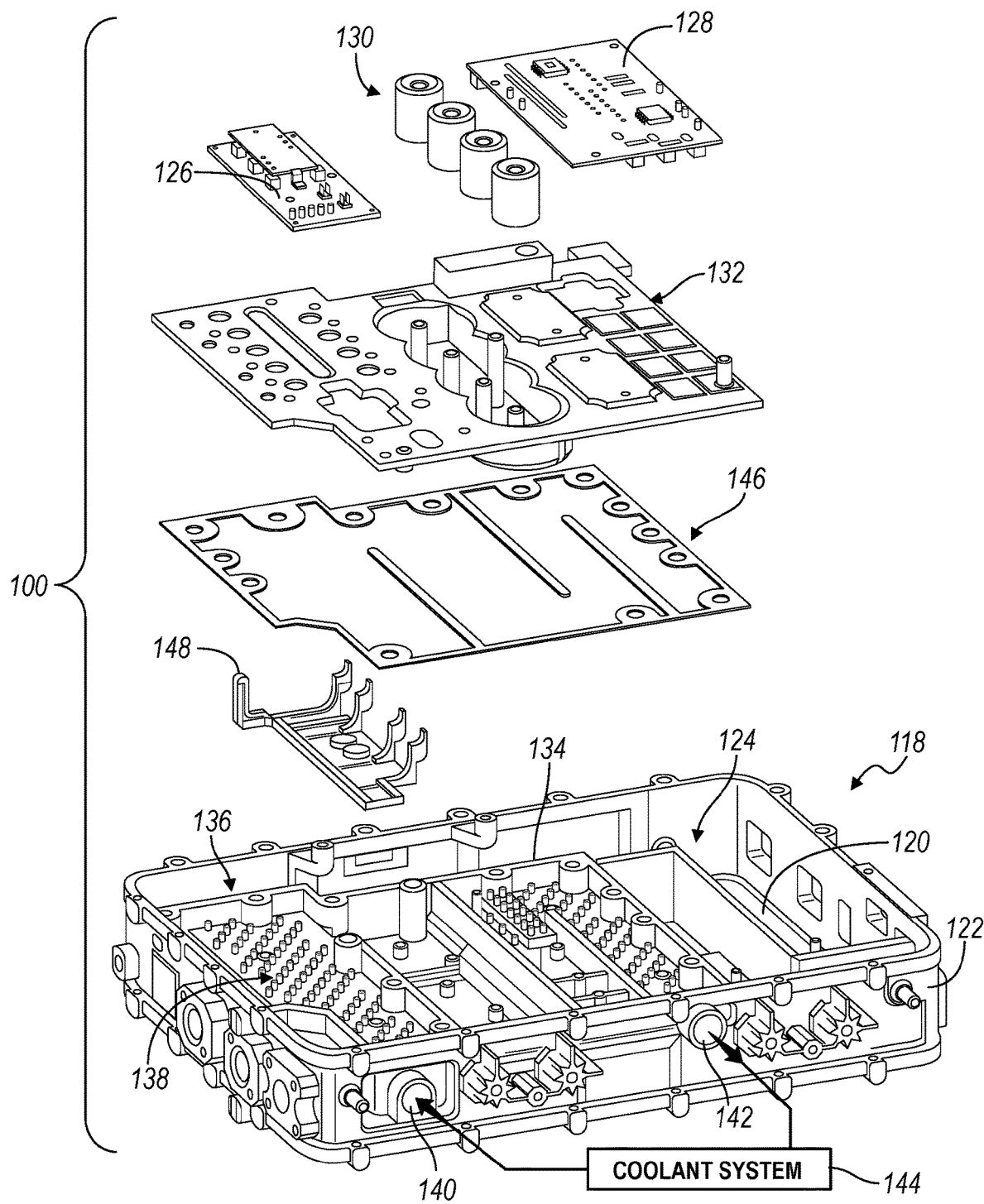
FIG. 2 is an exploded top perspective view of the high-voltage junction box, illustrating a cold plate and a baffle according to one embodiment.

Referring to FIG. 2, the HVJB 100 includes a housing 118 that mounts to a vehicle chassis (not shown). The housing 118 includes a base 120 and a sidewall 122 that extends transversely from the base 120 to form a cavity 124. The HVJB 100 includes multiple circuit board assemblies that are supported by the housing 118 within the cavity 124. In the illustrated embodiment, the HVJB 100 includes a first circuit board assembly 126, a second circuit board assembly 128, and a series of inductors 130 that are all mounted to a cover, such as a cold plate 132 and disposed within the cavity 124. The circuit board assemblies 126, 128, and the inductors 130 includes power electronics, e.g., for converting the AC power to high-voltage (HV) DC power. Such power conversion generates heat. The HVJB 100 may include a second cavity formed on an underside of the housing 118 for receiving additional circuit board assemblies (not shown).

The cold plate 132 mounts atop inner housing walls 134 to form a manifold 136 within the cavity 124 of the housing 118. The cold plate 132 acts as a heat extractor or heat sink and dissipates heat from the power electronics. The housing 118 also includes a plurality of protuberances 138 that extend from the base 120 into the manifold 136 that increase the overall surface area of the housing 118 and act as heat sinks.

The HVJB 100 facilitates coolant flow through the manifold 136 to absorb and remove heat generated by the power electronics. The housing 118 includes an inlet port 140 and an outlet port 142 that extend through the sidewall 122. The inlet port 140 and outlet port 142 are connected to a coolant system 144 for circulating liquid coolant through the manifold 136. The HVJB 100 may include a gasket 146 that is disposed between the cold plate 132 and the inner housing walls 134 to seal the coolant within the manifold 136. The coolant absorbs heat from the housing 118, including the protuberances 138, and the cold plate 132 as it circulates through the manifold 136.

Figure 3:
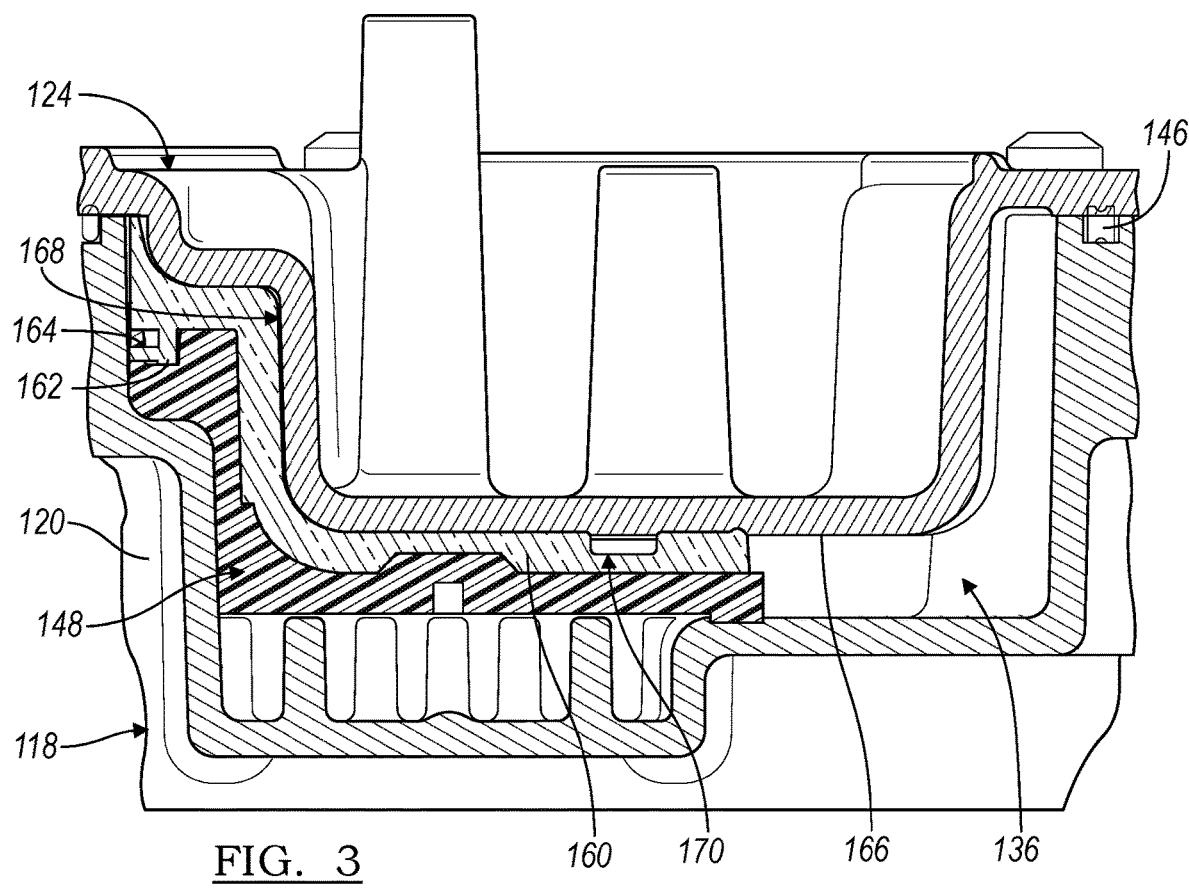
FIG. 3 is a vertical section view of the high-voltage junction box of FIG. 2.
Figure 4:
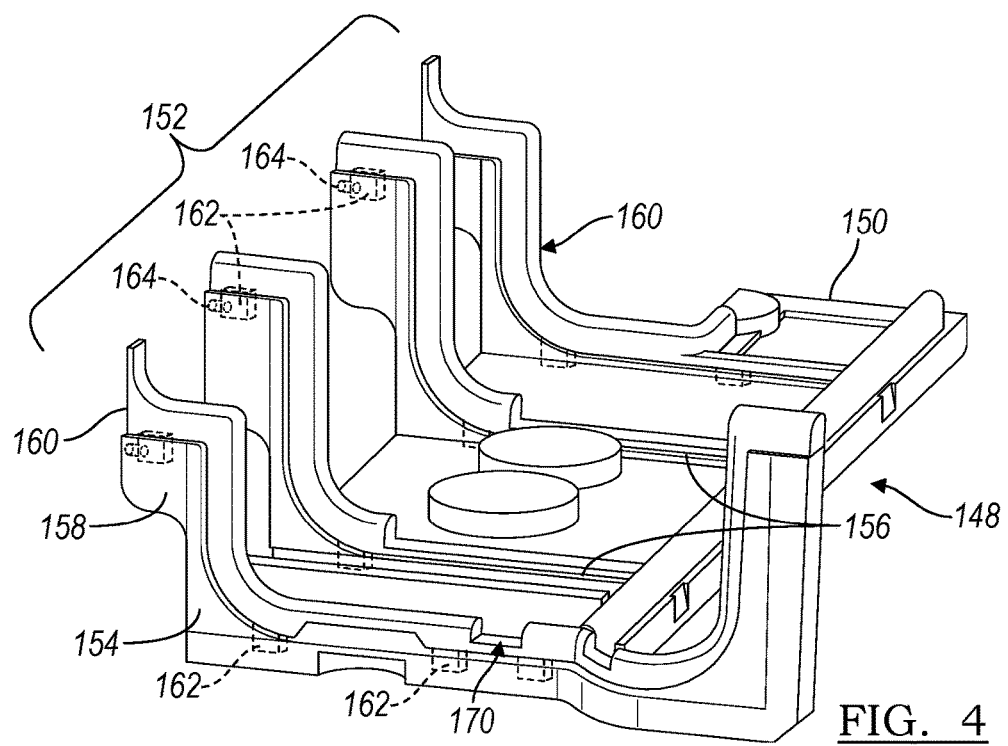
FIG. 4 is a top perspective view of the baffle of FIG. 2.

With reference to FIGS. 3 and 4, the HVJB 100 includes a baffle 148 for directing coolant flow through the manifold 136. The manifold 136 and the baffle 148 may be collectively referred to as a manifold assembly. The baffle 148 includes a support 150 that rests upon the base 120 of the housing, and a plurality of fins 152 that extend from the support 150. Each fin 152 includes an upright portion 154 that extends transversely from a side of the support 150. Each fin 152 also includes a ridge 156 that extends from a proximal end of the upright portion 154 across the support, and a tab 158 that extends laterally outward from a distal end of the upright portion 154. The plurality of fins 152 are longitudinally spaced apart from each other along a length of the support 150. The baffle 148 also includes elastic material 160 that is disposed on distal ends of the fins 152. The elastic material 160 is designed to withstand high temperature conditions, e.g., over 140 degrees Celsius. The support 150 and the fins 152 are formed as a unitary rigid polymeric structure, according to one or more embodiments. In one embodiment, the baffle 148 is formed by over-molding a silicone elastic material 160 over the distal ends of the fins 152.

The baffle 148 may include features for securing the elastic material 160 on the fins 152. The elastic material 160 may adhere to the fins 152 during the over-mold process. Further, each fin 152 may include one or more pockets 162 that are formed into a top surface of the tab 158 to receive elastic material 160, e.g., in the tab 158, and/or along the length of the ridge 156. Each fin 152 may also include an aperture 164 that extends from the pocket 162 and through a side of the fin 152. In the illustrated embodiment, the aperture 164 extends transversely from the pocket 162 and laterally through the tab 158. In other embodiments the aperture 164 extends downward from the pocket 162 and through the tab 158; or extends longitudinally from the pocket 162 through a front or rear surface of the tab 158 (not shown). The elastic material 160 flows into the pocket 162 and out through the aperture 164 to further secure the elastic material 160 to the fin 152.

As illustrated in FIG. 3, the baffle 148 is located between the cold plate 132 and the base 120 of the housing 118 to direct coolant flow. In some locations, the fins 152 engage a lower surface 166 of the cold plate 132 to block coolant leakage, as represented by numeral 168. In other locations, the fins 152 include openings 170 to permit coolant flow. The coolant takes the path of least resistance through the manifold 136 between the inlet port 140 and the outlet port 142. The baffle 148 directs the coolant flow to maximize heat transfer from the housing 118 and the cold plate 132 and minimize coolant turbulence, stagnation, and leakage.

Figure 5:
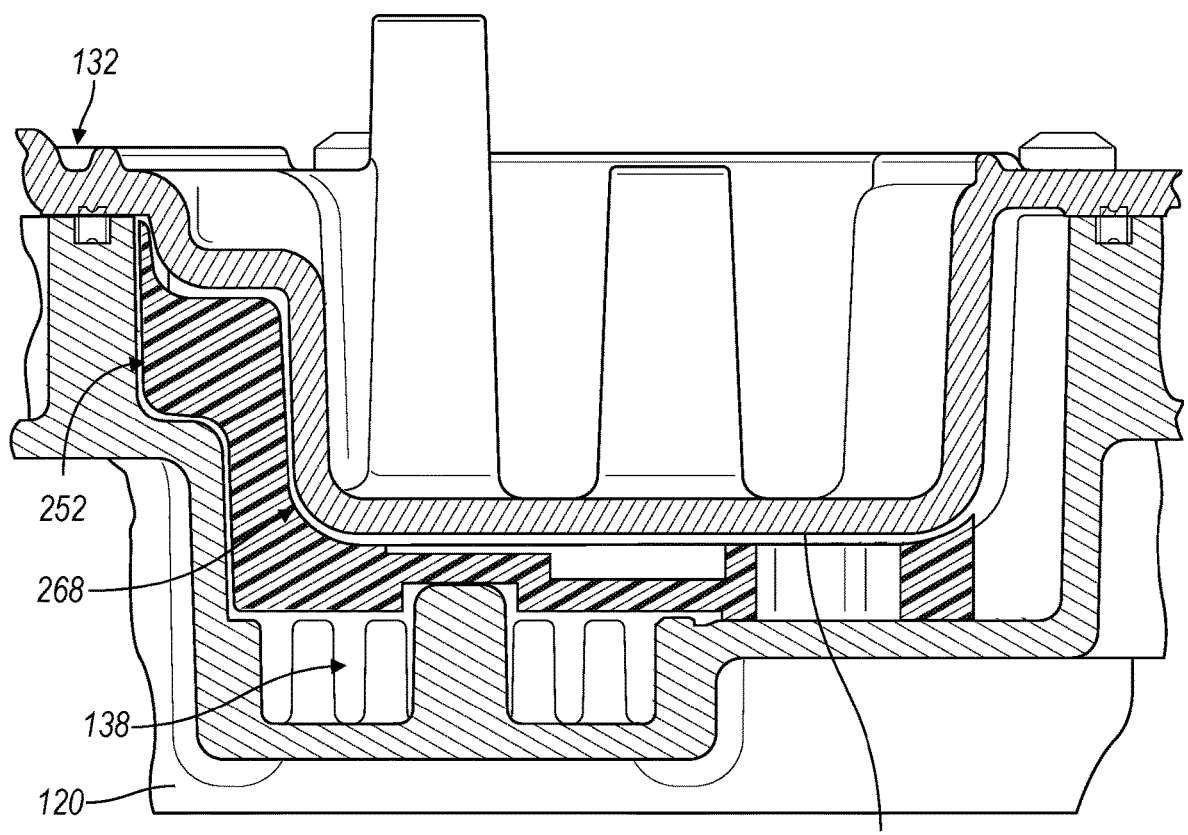
FIG. 5 is a vertical section view of the high-voltage junction box, illustrating a cold plate and a baffle according to another embodiment.
Figure 6:
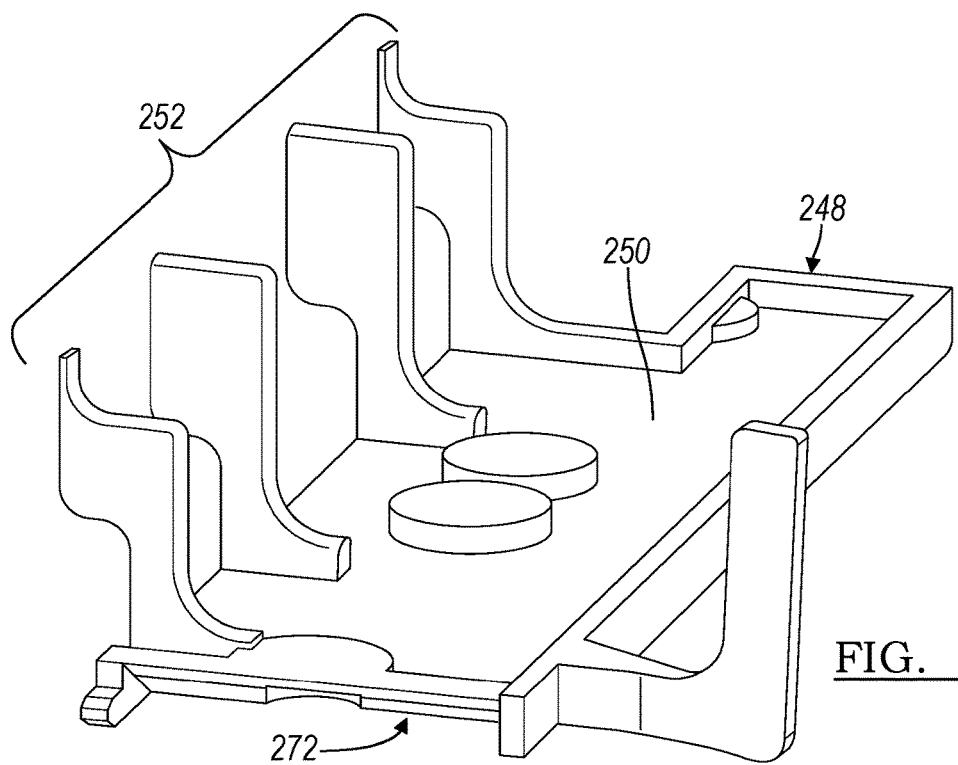
FIG. 6 is a top perspective view of the baffle of FIG. 5.

FIGS. 5 and 6 illustrate a baffle 248 according to another embodiment. Like the baffle 148 illustrated in FIGS. 3 and 4, the baffle 248 includes a support 250 and a plurality of fins 252 that extend from the support 250. The support 250 and the fins 252 are also formed as a unitary rigid polymeric structure. However, the baffle 248 does not include elastic material disposed on distal ends of the fins 252. The baffle 248 is located between the cold plate 132 and the base 120 of the housing 118 to direct coolant flow. In some locations, the fins 252 are designed to engage a lower surface 166 of the cold plate 132 to block coolant leakage. However due to manufacturing tolerances of the cold plate 132 and the baffle 248, the distal ends of the fins 252 may not fully engage the lower surface 166 of the cold plate 132 in all locations resulting in a gap 268. Such a gap 268 may result in coolant leakage and inefficient heat transfer from the housing 118 and cold plate 132. The support 250 may include an angled edge 272 to provide laminar fluid flow above and/or below the baffle 248. For example, the angled edge 272 is shown beveled downward in FIG. 5 to direct coolant flow below the baffle 248. In other embodiments the angled edge 272 may be beveled upward to direct coolant flow above the baffle 248 (not shown).

Referring back to FIGS. 3 and 4, the support 150 of the baffle 148 may also include an angled edge (not shown) to provide laminar fluid flow above and/or below the baffle 148. Additionally, the baffle 148 is designed to provide an interference fit between the elastic material 160 on the distal ends of the fins 152 and the lower surface 166 of the cold plate 132 to eliminate any potential gaps due to tolerances and limit coolant leakage. The baffle 148 provides improvements over other baffles, such as the baffle 248, by reducing interferences or gaps between the baffle and cold plate which improves heat transfer and thermal efficiency.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A manifold assembly comprising:
   a housing with a base, walls extending transversely from the base, and an inlet port and an outlet port formed through the walls;
   a cover mounted on top of the walls to define a manifold for coolant flow;
   a baffle disposed within the manifold to direct coolant flow between the inlet port and the outlet port;
   elastic material disposed over a distal end of the baffle to engage a lower surface of the cover and block coolant leakage,
   wherein the baffle further comprises:
      a support; and
      at least one fin extending transversely from the support, wherein the elastic material is disposed over a distal end of the at least one fin.

2. An electronic module comprising the manifold assembly of claim 1; and
   a circuit board assembly in thermal communication with the manifold, the circuit board assembly comprising electronics that generate heat during operation.

3. The manifold assembly of claim 1, wherein the at least one fin comprises:
   an upright portion extending transversely from the base;
   a ridge extending laterally from a proximal end of the upright portion across a width of the support; and
   a tab extending laterally outward from the upright portion.

4. The manifold assembly of claim 3, wherein a pocket is formed into a surface of at least one of the upright portion, the ridge, and the tab, to receive the elastic material and to secure the elastic material to the at least one fin.

5. The manifold assembly of claim 4, wherein an aperture is formed in the at least one fin, extending from the pocket and through a side surface of the at least one fin to receive the elastic material and further secure the elastic material to the at least one fin.

6. The manifold assembly of claim 4, wherein an aperture is formed in the at least one fin, extending transversely from the pocket and through the tab to receive the elastic material and further secure the elastic material to the at least one fin.

7. The manifold assembly of claim 1, wherein a support of the baffle is formed with an angled edge to direct laminar coolant flow around the support.

8. The manifold assembly of claim 1, wherein the housing comprises a series of protuberances extending from the base to increase a surface area of the housing, wherein the baffle is disposed over the series of protuberances, and wherein a support of the baffle is formed with an angled edge to direct laminar coolant flow around the support and through the series of protuberances.

9. An electronic module comprising:
   a housing with a base and walls extending transversely from the base, the housing comprising an inlet port and an outlet port formed through the walls;
   a circuit board assembly supported by the housing, the circuit board assembly comprising electronics that generate heat during operation;
   a cold plate mounted to the walls of the housing to define a manifold, wherein the housing and the cold plate are in thermal communication with the circuit board assembly for transferring heat generated by the electronics; and
   a baffle disposed within the manifold for directing coolant flow; and
   elastic material disposed over a distal end of the baffle and adapted to engage a lower surface of the cold plate in an interference fit to block coolant leakage,
   wherein the baffle further comprises:
      a support; and
      a fin extending transversely from the support, wherein the elastic material is disposed over a distal end of the fin.

10. The electronic module of claim 9, wherein the fin comprises a series of fins spaced apart from each other along a length of the support.

11. The electronic module of claim 9, wherein a pocket is formed into a surface of the fin to receive the elastic material, and wherein an aperture is formed in the fin, extending from the pocket and through another surface of the fin to receive the elastic material.

12. The electronic module of claim 9, wherein the fin comprises:
   an upright portion extending away from the base;
   a ridge extending from the upright portion across the support; and
   a tab extending outward from the upright portion.

13. The electronic module of claim 12, wherein a pocket is formed into a surface of the fin to receive the elastic material.

14. The electronic module of claim 13, wherein an aperture is formed into the fin, extending from the pocket and through another surface of the fin to receive the elastic material and further secure the elastic material to the fin.

15. The electronic module of claim 9, wherein a support of the baffle is formed with an angled edge to direct laminar coolant flow around the support.

16. The electronic module of claim 9, wherein the housing comprises a series of protuberances extending from the base to increase a surface area of the housing, wherein the baffle is disposed over the series of protuberances, and wherein a support of the baffle is formed with an angled edge to direct laminar coolant flow around the support and through the series of protuberances.

17. A manifold assembly comprising:
   a housing with a base, walls extending transversely from the base, and an inlet port and an outlet port formed through the walls;
   a cover mounted on top of the walls to define a manifold for coolant flow;

a baffle disposed within the manifold to direct coolant flow between the inlet port and the outlet port; and elastic material disposed over a distal end of the baffle to engage a lower surface of the cover and block coolant leakage, wherein the housing comprises a series of protuberances extending from the base to increase a surface area of the housing, wherein the baffle is disposed over the series of protuberances, and wherein a support of the baffle is formed with an angled edge to direct laminar coolant flow around the support and through the series of protuberances.

18. The manifold assembly of claim 17, wherein the baffle further comprises:

a support; and a fin extending transversely from the support, wherein the elastic material is disposed over a distal end of the fin.

19. The manifold assembly of claim 18, wherein the fin comprises:

an upright portion extending transversely from the base;

a ridge extending laterally from a proximal end of the upright portion across a width of the support; and a tab extending laterally outward from the upright portion.

20. The manifold assembly of claim 19, wherein a pocket is formed into a surface of at least one of the upright portion, the ridge, and the tab, to receive the elastic material and to secure the elastic material to the fin.

* * * * *